(12) United States Patent
Furuhashi

(10) Patent No.: US 10,943,632 B2
(45) Date of Patent: Mar. 9, 2021

(54) MAGNETIC STORAGE DEVICE

(71) Applicant: TOSHIBA MEMORY CORPORATION, Tokyo (JP)

(72) Inventor: Hironobu Furuhashi, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,181

(22) Filed: Sep. 3, 2019

(65) Prior Publication Data
US 2020/0303454 A1 Sep. 24, 2020

(30) Foreign Application Priority Data

Mar. 18, 2019 (JP) .............................. JP2019-049553

(51) Int. Cl.
| | | |
|---|---|---|
| G11C 11/16 | (2006.01) | |
| H01L 27/22 | (2006.01) | |
| H01L 45/00 | (2006.01) | |
| H01F 10/32 | (2006.01) | |
| H01L 43/02 | (2006.01) | |
| G11C 11/02 | (2006.01) | |

(52) U.S. Cl.
CPC .......... *G11C 11/1675* (2013.01); *G11C 11/02* (2013.01); *G11C 11/161* (2013.01); *H01F 10/329* (2013.01); *H01F 10/3254* (2013.01); *H01F 10/3286* (2013.01); *H01L 27/224* (2013.01); *H01L 43/02* (2013.01); *H01L 45/1233* (2013.01); *H01L 45/1253* (2013.01); *H01L 45/141* (2013.01)

(58) Field of Classification Search
CPC ... H01L 27/224; H01L 45/1233; H01L 43/02; H01L 45/1253; H01L 45/141; G11C 11/161; G11C 11/1675; H01F 10/3286; H01F 10/329; H01F 10/3254
See application file for complete search history.

(56) References Cited

U.S. PATENT DOCUMENTS

| 7,239,545 B2 | 7/2007 | Hosotani |
|---|---|---|
| 7,515,457 B2 | 4/2009 | Chen et al. |
| 7,974,121 B2 | 7/2011 | Li et al. |
| 8,750,032 B2 | 6/2014 | Kawahara et al. |

(Continued)

FOREIGN PATENT DOCUMENTS

| JP | 2010067942 A | 3/2010 |
|---|---|---|
| JP | I597725 B | 9/2017 |

*Primary Examiner* — Ajay Ojha
(74) *Attorney, Agent, or Firm* — Kim & Stewart LLP

(57) ABSTRACT

A magnetic storage device includes a memory cell with a magnetoresistive effect element and a switching element connected in series. The magnetoresistive effect element is configured to change from a first resistance state to a second resistance state that is lower in resistance than the first resistance state in response to a first write operation flowing current in a first direction through the memory cell and to change from the second resistance state to the first resistance state in response to a second write operation flowing current in a second direction through the memory cell. The switching element has a first voltage drop associated with current flows in the first direction and has a second voltage drop associated with current flows the second direction that is lower than the first voltage drop.

19 Claims, 8 Drawing Sheets

(56) References Cited

U.S. PATENT DOCUMENTS

| | | |
|---|---|---|
| 9,082,497 B2 | 7/2015 | Suzuki |
| 9,425,237 B2 | 8/2016 | Jo |
| 2006/0198184 A1* | 9/2006 | Yoda ................. G11C 11/16 365/171 |
| 2007/0012972 A1* | 1/2007 | Nakayama ............ H01L 27/228 257/295 |
| 2009/0168501 A1* | 7/2009 | Ito ................... G11C 11/1659 365/158 |
| 2010/0038617 A1 | 2/2010 | Nakajima et al. |
| 2014/0146600 A1 | 5/2014 | Sohn et al. |
| 2015/0249096 A1 | 9/2015 | Lupino et al. |

* cited by examiner

MAGNETIC STORAGE DEVICE

CROSS-REFERENCE TO RELATED APPLICATION(S)

This application is based upon and claims the benefit of priority from Japanese Patent Application No. 2019-049553, filed Mar. 18, 2019, the entire contents of which are incorporated herein by reference.

FIELD

Embodiments described herein relate generally to a magnetic storage device.

BACKGROUND

Magnetic storage devices, such as MRAM (magnetoresistive random access memory), using a magnetoresistive effect element as a storage element is known.

DETAILED DESCRIPTION

Figure 1:
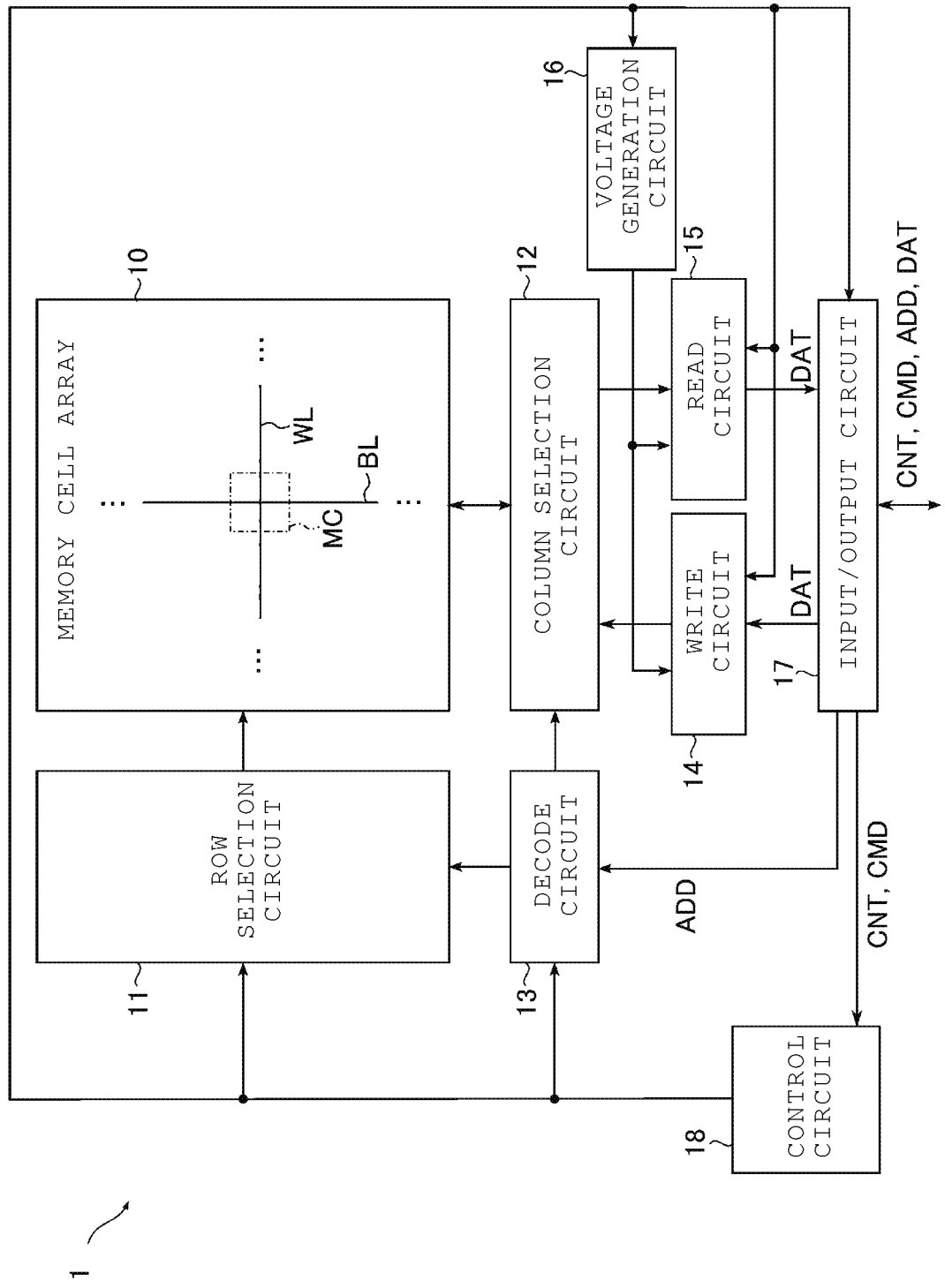
FIG. 1 is a block diagram of a magnetic storage device according to a first embodiment.

In general, according to one embodiment, a magnetic storage device includes a memory cell with a magnetoresistive effect element and a switching element connected in series. The magnetoresistive effect element is configured to change from a first resistance state to a second resistance state that is lower resistance than the first resistance state in response to a first write operation in which a current flows in a first direction through the memory cell and to change from the second resistance state to the first resistance state in response to a second write operation in which a current flows in a second direction opposite to the first direction through the memory cell. The switching element has a first voltage drop associated with current flows in the first direction and has a second voltage drop associated with current flows in the second direction and that is less than the first voltage drop.

Hereinafter, example embodiments will be described with reference to drawings. In the following description, elements having the same function and configuration are denoted by the same reference numerals. When a plurality of elements having the same reference numeral are to be distinguished from each other a suffix may be appended to the reference numeral. When there is no need to distinguish between elements of the same type, only the common reference is utilized, and suffixes are not added thereto. The suffixes may be subscripts and/or superscripts and include, for example, lower case letters and/or indexing values to denote relative positions in an arrangement, a sequence, or the like.

1. First Embodiment

The magnetic storage device according to the first embodiment is, for example, a perpendicular magnetization-type magnetic storage device using an element functioning by a magnetoresistive effect of a magnetic tunnel junction (MTJ) as a resistance-variable element. This element may be referred to as an MTJ element or a magnetoresistive effect element in some contexts.

1.1 Configuration

First, the configuration of the magnetic storage device according to the first embodiment will be described.

1.1.1 Configuration of Magnetic Storage Device

FIG. 1 is a block diagram of a magnetic storage device 1 according to the first embodiment. As shown in FIG. 1, magnetic storage device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC each associated with a particular row and column. The memory cells MC in the same row are connected to the same word line WL, and the memory cells MC in the same column are connected to the same bit line BL.

The row selection circuit 11 is connected to the memory cell array 10 via the word lines WL. The row address of an address ADD from the decode circuit 13 is supplied to the row selection circuit 11. The row selection circuit 11 selects the word lines WL based the row address. A word line WL in a selected state is referred to as a selected word line WL. The word lines WL other than the selected word line(s) WL are referred to as non-selected word lines WL.

The column selection circuit 12 is connected to the memory cell array 10 via the bit lines BL. The column address of the address ADD from the decode circuit 13 is supplied to the column selection circuit 12. The column selection circuit 12 selects a column (or columns) based on the decoding result of the address ADD. A bit line BL in a selected state is referred to as a selected bit line BL. The bit lines BL other than the selected bit line(s) BL are referred to as non-selected bit lines BL.

The decode circuit 13 decodes the address ADD from the input/output circuit 17. The decode circuit 13 supplies the decoding result corresponding to the address ADD to the row selection circuit 11 and the column selection circuit 12. The address ADD includes a column address and a row address for memory cells MC to be selected.

The write circuit 14 writes data to the memory cells MC. The write circuit 14 includes, for example, a write driver (not separately depicted).

The read circuit 15 reads data from the memory cells MC. The read circuit 15 includes, for example, a sense amplifier (not separately depicted).

The voltage generation circuit 16 generates voltages for various operations of the memory cell array 10 by using a power supply voltage provided externally of the magnetic storage device 1. For example, the voltage generation circuit 16 generates various voltages necessary for write operations and outputs the generated voltages to the write circuit 14. For example, the voltage generation circuit 16 generates various voltages necessary for read operations and outputs the generated voltages to the read circuit 15.

The input/output circuit 17 transfers the address ADD, received from outside of the magnetic storage device 1, to the decode circuit 13. The input/output circuit 17 transfers a command CMD, received from the outside of the magnetic storage device 1, to the control circuit 18. The input/output circuit 17 transmits and receives various control signals CNT between the outside of the magnetic storage device 1 and the control circuit 18. The input/output circuit 17 transfers data DAT, received from the outside of the magnetic storage device 1, to the write circuit 14 and outputs data DAT, received from the read circuit 15, to the outside of the magnetic storage device 1.

The control circuit 18 controls the operations of the row selection circuit 11, the column selection circuit 12, the decode circuit 13, the write circuit 14, the read circuit 15, the voltage generation circuit 16, and the input/output circuit 17 based on the control signals CNT and the commands CMD.

1.1.2 Configuration of Memory Cell Array

Figure 2:
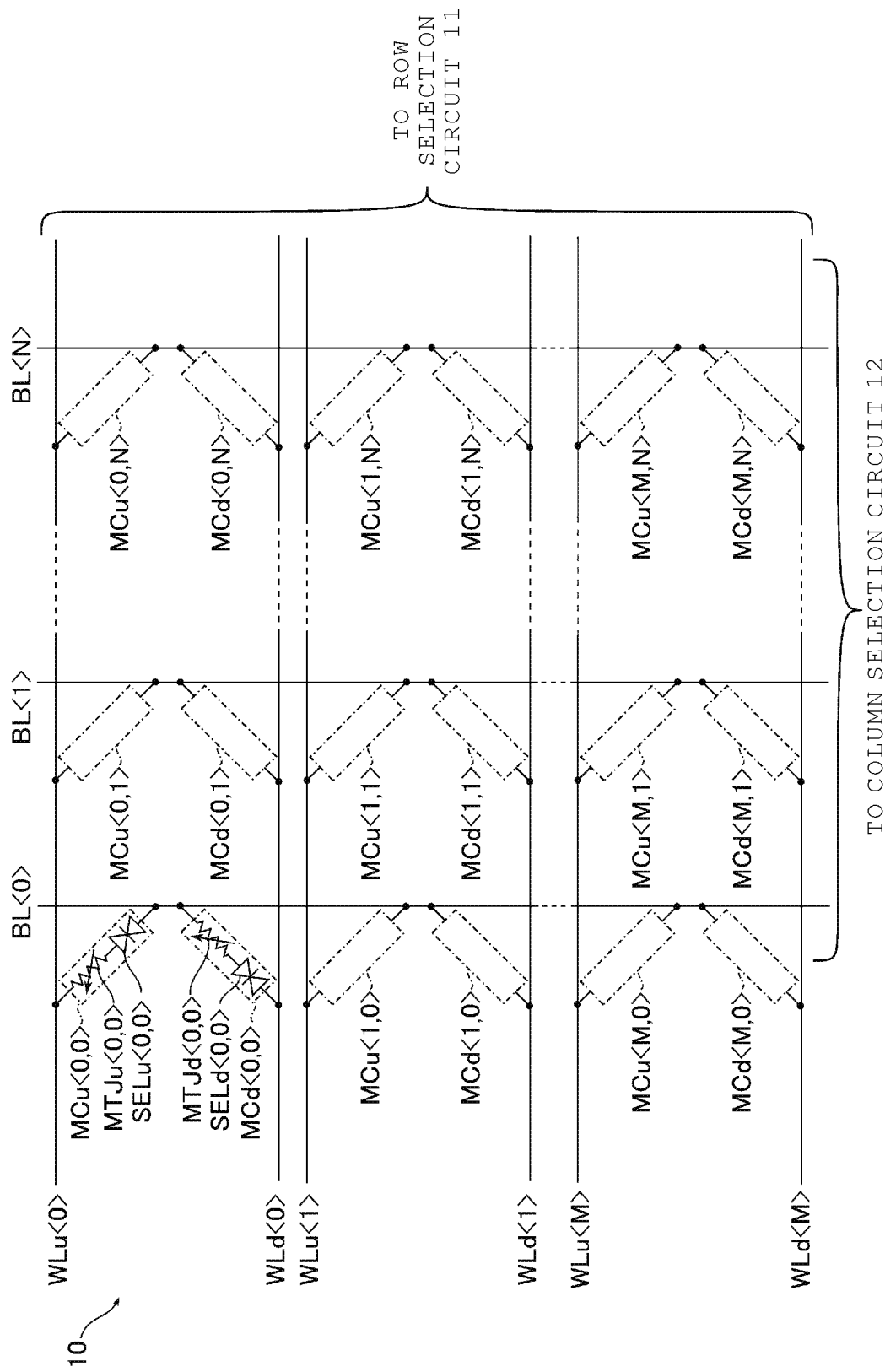
FIG. 2 is a circuit diagram of a memory cell array of a magnetic storage device according to a first embodiment.

Next, the configuration of the memory cell array of the magnetic storage device according to the first embodiment will be described with reference to FIG. 2. FIG. 2 is a circuit diagram showing a configuration of the memory cell array of the magnetic storage device according to the first embodiment. In FIG. 2, the word lines WL further designated by suffixes including one of two lower case letters ("u" and "d") and an index value ("< >") of 0 to M.

As shown in FIG. 2, the memory cells MC are arranged in a matrix configuration in the memory cell array 10 and are associated with one of a plurality of bit lines BL (BL<0>, BL<1> . . . BL<N>) and one of a plurality of word lines WLd (WLd<0>, WLd<1> . . . WLd<M>) or one a plurality of word lines WLu (WLu<0>, WLu<1> . . . WLu<M>), where M and N are integers. Memory cells MC connected to one of the plurality of word lines WLu (WLu<0>, WLu<1> . . . WLu<M>) are denoted as memory cells MCu. Thus, in this notation, a memory cell MCd<i, j> (0≤i≤M, 0≤j≤N) is connected between a word line WLd<i> and a bit line BL<j>, and a memory cell MCu<i, j> is connected between a word line WLu<i> and a bit line BL<j>.

The suffixes "d" and "u" respectively identify memory cells MC as provided below and above for example one of the bit lines BL. An example of the three-dimensional structure of the memory cell array 10 will be further described below.

The memory cell MCd<i, j> includes a switching element SELd<i, j> and a magnetoresistive effect element MTJd<i, j> connected in series. The memory cell MCu<i, j> includes a switching element SELu<i, j> and a magnetoresistive effect element MTJu<i, j> connected in series.

The switching element SEL controls the supply of a current to the magnetoresistive effect element MTJ when data is written to and read from the corresponding magnetoresistive effect element MTJ. More specifically, for example, the switching element SEL in a certain memory cell MC shuts off the current flow by acting as an insulator having a large resistance value (turns off) when the voltage applied to the memory cell MC is equal to or less than a threshold voltage Vt, and allows a current to flow by acting as a conductor having a small resistance value (turns on) when the voltage applied to the memory cell MC exceeds the threshold voltage Vt. That is, the switching element SEL has a function of switching whether the current flows or not according to the magnitude of the voltage applied to the memory cell MC regardless of the direction of the flowing current.

The magnetoresistive effect element MTJ may switch resistance value between a low resistance state and a high resistance state according to the current supply controlled by the switching element SEL. The magnetoresistive effect element MTJ may store data as a change in the resistance state thereof, and stores written data in a nonvolatile manner, and functions as a readable storage element.

Figure 3:
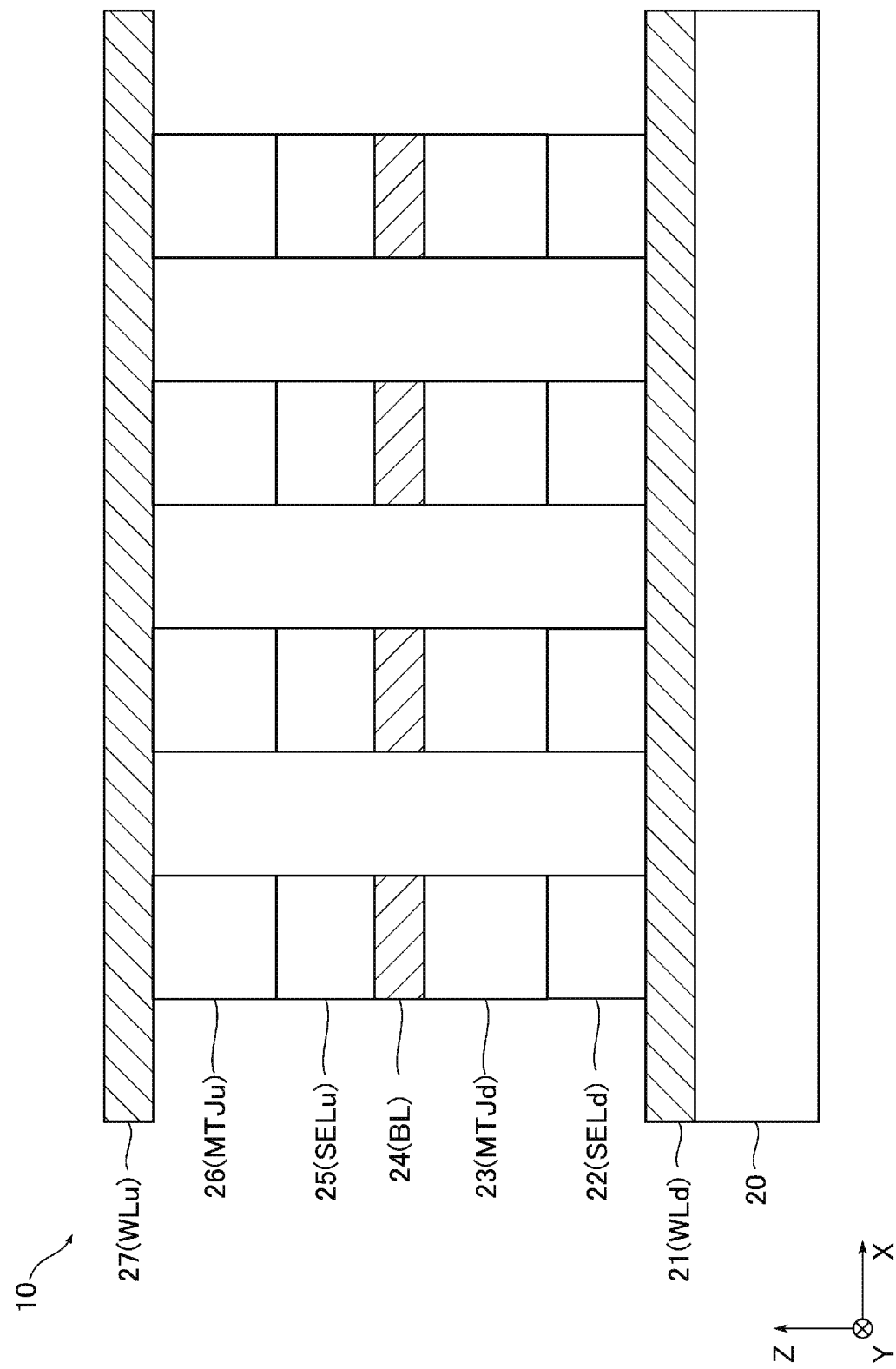
FIG. 3 is a cross-sectional view of a memory cell array of a magnetic storage device according to a first embodiment.
Figure 4:
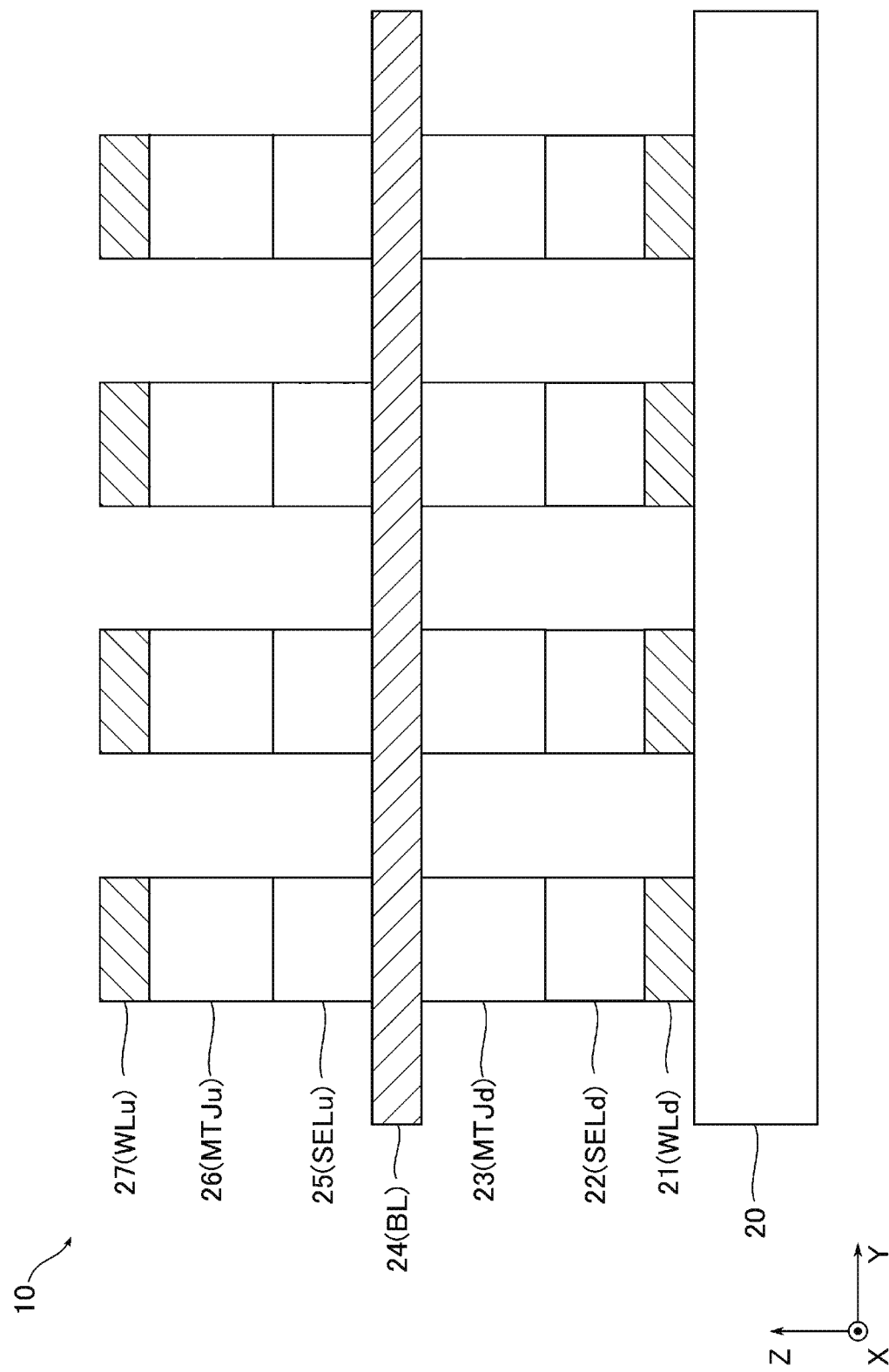
FIG. 4 is a cross-sectional view of a memory cell array of a magnetic storage device according to a first embodiment.

Next, the cross-sectional structure of the memory cell array 10 will be described with reference to FIGS. 3 and 4. FIGS. 3 and 4 show examples of a cross-sectional view showing the configuration of the memory cell array of the magnetic storage device according to the first embodiment. FIGS. 3 and 4 are cross-sectional views of the memory cell array 10 as viewed from different directions which cross each other.

As shown in FIGS. 3 and 4, the memory cell array 10 is provided on a semiconductor substrate 20. In the following description, a plane parallel to the surface of the semiconductor substrate 20 is taken as an XY plane, and a direction orthogonal to the XY plane is taken as a Z direction. Further, the direction along the word lines WL is taken to as an X direction, and the direction along the bit lines BL is taken to as a Y direction. That is, FIGS. 3 and 4 are cross-sectional views of the memory cell array 10 as viewed in the Y direction and the X direction, respectively.

A plurality of conductors 21 is provided on the semiconductor substrate 20. The plurality of conductors 21 function as word lines WLd. The plurality of conductors 21 are disposed side by side along the Y direction, and each extends along the X direction. Although FIGS. 3 and 4 illustrate the case where the conductors 21 are provided on the semiconductor substrate 20, the present disclosure is not limited thereto. For example, the plurality of conductors 21 may be stacked upwardly without each being in direct contact with the semiconductor substrate 20.

Elements 22, each functioning as a switching element SELd, are provided on an upper surface of a conductor 21. The elements 22 are provided side by side along the X direction, for example. That is, the elements 22 arranged along the X direction are commonly connected to the upper surface of one conductor 21.

An element 23 functioning as a magnetoresistive effect element MTJd is provided on an upper surface of each of the elements 22. An upper surface of each of the elements 23 is connected to one the conductors 24. The conductors 24 function as bit lines BL. For example, the conductors 24 are provided side by side along the X direction, and each extends along the Y direction. That is, the elements 23 arranged along the Y direction are commonly connected to one conductor 24. Although FIGS. 3 and 4 illustrate the case where each of the elements 23 is provided on an element 22 and a conductor 24, the present disclosure is not limited thereto. For example, each of the elements 23 may be connected to an element 22 and a conductor 24 via a conductive contact plug.

Elements 25 each functioning as a switching element SELu are provided on an upper surface of a conductor 24. The elements 25 provided on the upper surface of a conductor 24 are provided side by side along the Y direction, for example. That is, the elements 25 arranged along the Y direction are commonly connected to the upper surface of one conductor 24. Each element 25 has, for example, the same configuration as that of the elements 22.

An element 26 functioning as a magnetoresistive effect element MTJu is provided on an upper surface of each of the elements 25. An upper surface of each of the elements 26 is connected to one of the conductors 27. The conductors 27 have function as word lines WLu. The conductors 27 are provided side by side along the Y direction, and each extend along the X direction. That is, the elements 26 arranged along the X direction are commonly connected to one conductor 27. Although FIGS. 3 and 4 illustrate the case where each of the elements 26 is provided on an element 25 and a conductor 27, the present disclosure is not limited thereto. For example, each of the elements 26 may be connected to an element 25 and a conductor 27 via a conductive contact plug.

The memory cell array 10 has a structure in which a pair of word lines WLd and WLu corresponds to each bit line BL. The memory cell array 10 has a structure in which the memory cell MCd is between the word line WLd and the bit line BL, the memory cell MCu is between the bit line BL and the word line WLu, and a plurality of layers provided at different heights in the Z direction form the memory cell array 10. In the structure shown in FIGS. 3 and 4, the memory cell MCd is associated with the lower layer, and the memory cell MCu is associated with the upper layer. That is, among the memory cells MC commonly connected to one bit line BL, the memory cell MC provided on the upper surface of the bit line BL corresponds to the memory cell MCu, and the memory cell MC provided on the lower surface of the bit line BL corresponds to the memory cell MCd.

1.1.3 Memory Cell

Figure 5:
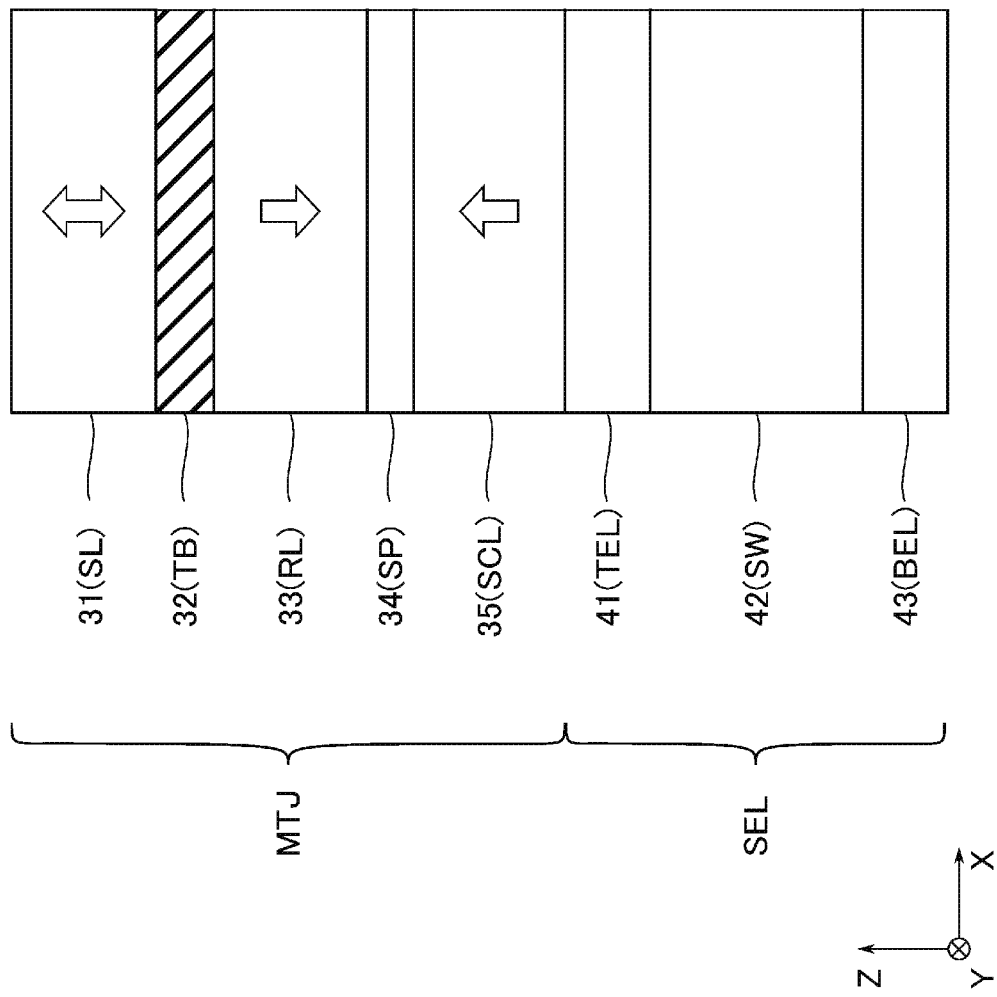
FIG. 5 is a cross-sectional view of a memory cell of a magnetic storage device according to a first embodiment.

Next, the configuration of the memory cells MC of the magnetic storage device according to the first embodiment will be described with reference to FIG. 5. FIG. 5 is a cross-sectional view of a memory cell MC. For example, FIG. 5 shows an example of a cross section of a memory cell MCd depicted in FIGS. 3 and 4 along a plane (for example, XZ plane) perpendicular to the Z direction. Since the memory cell MCu has the same configuration as the memory cell MCd, the specific illustration thereof is omitted.

1.1.3.1 Magnetoresistive Effect Element

First, the magnetoresistive effect element MTJ in the memory cell MC will be described.

As shown in FIG. 5, the magnetoresistive effect element MTJ includes, for example, a ferromagnetic body 31 functioning as a storage layer SL, a nonmagnetic body 32 functioning as a tunnel barrier layer TB, a ferromagnetic body 33 functioning as a reference layer RL, a nonmagnetic body 34 functioning as a spacer layer SP, and a ferromagnetic body 35 functioning as a shift cancelling layer SCL.

In the magnetoresistive effect element MTJd, films are stacked in the order of the ferromagnetic body 35, the nonmagnetic body 34, the ferromagnetic body 33, the nonmagnetic body 32, and the ferromagnetic body 31, from the word line WLd side to the bit line BL side (in the Z-axis direction), for example. In the magnetoresistive effect element MTJu, films are stacked in the order of the ferromagnetic body 35, the nonmagnetic body 34, the ferromagnetic body 33, the nonmagnetic body 32, and the ferromagnetic body 31, from the bit line BL side to the word line WLu side (in the Z-axis direction), for example. The magnetoresistive effect elements MTJd and MTJu function as perpendicular magnetization-type MTJ elements in which the magnetization directions of the magnetic bodies constituting the magnetoresistive effect elements MTJd and MTJu are respectively perpendicular to the film surface plane. The magnetoresistive effect element MTJ may include an additional layer (not specifically depicted) between any bodies of the bodies 31 to 35 described above.

The ferromagnetic body 31 has ferromagnetism and an easy magnetization axis direction in the direction orthogonal to the film surface plane. The ferromagnetic body 31 has a magnetization direction toward either the bit line BL side or the word line WL side. The ferromagnetic body 31 comprises at least one of iron (Fe), cobalt (Co), and nickel (Ni). The ferromagnetic body 31 may further comprise boron (B). More specifically, for example, the ferromagnetic body 31 is cobalt iron boride (CoFeB) or iron boride (FeB) and may have a body-centered cubic crystal structure.

The nonmagnetic body 32 is a nonmagnetic insulating film and includes, for example, magnesium oxide (MgO). The nonmagnetic body 32 is provided between the ferromagnetic body 31 and the ferromagnetic body 33 to form a magnetic tunnel junction with these two ferromagnetic bodies. The nonmagnetic body 32 has a body-centered cubic (bcc) crystal structure (e.g., a NaCl-like crystal structure in which the film surface is oriented in the (001) plane), and may also function as a seed layer serving as a nucleation point for growing a crystalline film from the interface with the ferromagnetic bodies 31 and 33 in the crystallization processing of the adjacent ferromagnetic bodies 31 and 33.

The ferromagnetic body 33 has an easy magnetization axis direction in the direction orthogonal to the film surface plane. The ferromagnetic body 33 has a magnetization direction toward either the bit line BL or the word line WL. The ferromagnetic body 33 comprises, for example, at least one of iron (Fe), cobalt (Co), and nickel (Ni). The ferromagnetic body 33 may further contain boron (B). More specifically, for example, the ferromagnetic body 33 is cobalt iron boride (CoFeB) or iron boride (FeB) and may have a body-centered cubic crystal structure. The magnetization direction of the ferromagnetic body 33 is fixed, and in the example of FIG. 5, is directed toward the ferromagnetic body 35. In this context, "the magnetization direction is fixed" means that the magnetization direction does not change due to a current (spin torque) at a magnitude that would reverse the magnetization direction of the ferromagnetic body 31.

Although not specifically depicted in FIG. 5, the ferromagnetic body 33 may comprise a stacked body including a plurality of layers of different materials. Specifically, a stacked body forming the ferromagnetic body 33 may have a structure in which additional ferromagnetic layers are stacked on each other via a nonmagnetic conductor on the surface on the ferromagnetic body 35 side of an interface layer containing cobalt iron boride (CoFeB) or iron boride (FeB) described above. The nonmagnetic conductor in the stacked body forming the ferromagnetic body 33 may include, for example, at least one metal selected from tantalum (Ta), hafnium (Hf), tungsten (W), zirconium (Zr), molybdenum (Mo), niobium (Nb), and titanium (Ti). The additional ferromagnetic body in the stacked body forming the ferromagnetic body 33 may include, for example, at least one multilayer film selected from a multilayer film of cobalt (Co) and platinum (Pt) layers, a multilayer film of cobalt (Co) and nickel (Ni) layers, and a multilayer film of cobalt (Co) and palladium (Pd) layers.

The nonmagnetic body 34 is a nonmagnetic conductive film and contains, for example, ruthenium (Ru).

The ferromagnetic body 35 has an easy magnetization axis direction in the direction orthogonal to the film surface plane. The ferromagnetic body 35 contains, for example, at least one alloy selected from cobalt-platinum (CoPt), cobalt-nickel (CoNi), and cobalt-palladium (CoPd). Similar to the ferromagnetic body 33, the ferromagnetic body 35 may be a stacked body including a plurality of layers. In that case, the ferromagnetic body 35 may include, for example, at least one multilayer film selected from a Co/Pt multilayer film, a Co/Ni multilayer film, and a Co/Pd multilayer film.

The ferromagnetic body 35 has a magnetization direction toward either of the bit line BL side or the word line WL side. The magnetization direction of the ferromagnetic body 35 is fixed in the same manner as the ferromagnetic body 33, and in the example of FIG. 5, is directed toward the ferromagnetic body 33.

The ferromagnetic bodies 33 and 35 are antiferromagnetically coupled to each other by the nonmagnetic body 34. That is, the ferromagnetic bodies 33 and 35 are coupled so as to have magnetization directions antiparallel to each other. For this reason, in the example of FIG. 5, the magnetization directions of the ferromagnetic bodies 33 and 35 are directed to face each other. Such a coupled structure of the ferromagnetic body 33, the nonmagnetic body 34, and the ferromagnetic body 35 is referred to as a synthetic anti-ferromagnetic (SAF) structure. Thereby, the ferromagnetic body 35 can offset the influence of the stray field of the ferromagnetic body 33 on the magnetization direction of the ferromagnetic body 31. For this reason, it is possible to prevent the occurrence of asymmetry in the ease with which the magnetization of the ferromagnetic body 31 can be reversed, that is, the ease with which the direction of magnetization of the ferromagnetic body 31 is changed differs according to the reversal direction (e.g., up/down in FIG. 5).

In the first embodiment, a spin injection writing method is employed in which a write current is supplied directly to a magnetoresistive effect element MTJ, and a spin torque is injected to the storage layer SL and the reference layer RL by the write current to control the magnetization direction of the storage layer SL and the magnetization direction of the reference layer RL. The magnetoresistive effect element MTJ can take either a low resistance state or a high resistance state depending on the relationship between the magnetization directions of the storage layer SL and the reference layer RL, that is whether these magnetization directions are parallel or antiparallel to one another.

When a write current Iapp of a certain magnitude is supplied to the magnetoresistive effect element MTJ in the direction of the arrow A1 in FIG. 5, that is, from the storage layer SL to the reference layer RL, the relationship between the magnetization directions of the storage layer SL and the reference layer RL is parallel. In the parallel state, the resistance value of the magnetoresistive effect element MTJ is the lowest, and the magnetoresistive effect element MTJ is set to the low resistance state. This low resistance state is called "P (Parallel) state" and is defined as, for example, a data value "0".

When a write current Ipap larger than the write current Iapp is supplied to the magnetoresistive effect element MTJ in the direction of the arrow A2 in FIG. 5, that is, in the direction (opposite to the arrow A1) from the reference layer RL to the storage layer SL, the relationship between the magnetization directions of the storage layer SL and the reference layer RL is antiparallel. In this antiparallel state, the resistance value of the magnetoresistive effect element MTJ is the highest, and the magnetoresistive effect element MTJ is set to the high resistance state. This high resistance state is called an "AP (Anti-Parallel) state" and is defined as, for example, a data value "1".

The following description will be made according to the above-described data definition method, but the way of defining data value "1" and data value "0" is not limited to the example described above. For example, the P state may be defined as data value "1", and the AP state may be defined as data value "0".

1.1.3.2 Switching Element

Next, the switching element SEL will be described with reference to FIG. 5.

In the example of FIG. 5, the switching element SEL is provided on the magnetoresistive effect element MTJ. However, the switching element SEL may be connected to the magnetoresistive effect element MTJ via a contact plug or the like.

The switching element SEL includes an electrode member 41 functioning as a top electrode TEL, a selector member 42, and an electrode member 43 functioning as a bottom electrode BEL. The switching element SEL functions as a two-terminal switching element, and when the voltage to be applied between two terminals is equal to or less than a threshold voltage, the switching element is in a "high resistance" state, for example, an electrically non-conductive state. When the voltage to be applied between the two terminals exceeds the threshold voltage, the switching element changes into a "low resistance" state, for example, an electrically conductive state. The switching element may have this function regardless of polarity of the applied voltage.

In the switching element SELd, for example, films are stacked in the order of the electrode member 43, the selector member 42, and the electrode member 41 from the word line WLd side to the bit line BL side (in the Z-axis direction). In the switching element SELu, for example, films are stacked in the order of the electrode member 43, the selector member 42, and the electrode member 41 from the bit line BL side to the word line WLu side (in the Z-axis direction). That is, in the example of FIG. 5, the direction from the electrode member 41 to the electrode member 43 corresponds to the direction from the ferromagnetic body 31 (storage layer SL) to the ferromagnetic body 33 (reference layer RL), that is, the flowing direction (arrow A1) of the write current Iapp for bringing the magnetoresistive effect element MTJ into the low resistance state. In addition, the direction from the electrode member 43 to the electrode member 41 corresponds to the direction from the ferromagnetic body 33 (reference layer RL) to the ferromagnetic body 31 (storage layer SL), that is, the flowing direction (arrow A2) of a write current Ipap for bringing the magnetoresistive effect element MTJ into the high resistance state.

The electrode member 41 prevents an increase in the parasitic resistance of the switching element SEL. The electrode member 41 contains, for example, at least one material selected from carbon (C), carbon nitride (CN), tungsten nitride (WN), and titanium nitride (TiN).

The selector member 42 is a core portion for the switching element SEL described above to function as a two-terminal switching element. The selector member 42 may contain, for example, at least one chalcogen element selected from the group consisting of tellurium (Te), selenium (Se), and sulfur (S). Alternatively, for example, chalcogenide which is a compound containing one of the above chalcogen elements may be contained. In addition to the above, the selector member 42 may also contain, for example, at least one element selected from the group consisting of boron (B), aluminum (Al), gallium (Ga), indium (In), carbon (C), silicon (Si), germanium (Ge), tin (Sn), arsenic (As), phosphorus (P), antimony (Sb), titanium (Ti), and bismuth (Bi). More specifically, the selector member 42 may contain at least two elements selected from germanium (Ge), antimony (Sb), tellurium (Te), titanium (Ti), arsenic (As), indium (In), and bismuth (Bi). Furthermore, the selector member 42 may contain an oxide of at least one element selected from titanium (Ti), vanadium (V), chromium (Cr), niobium (Nb), molybdenum (Mo), hafnium (Hf), and tungsten (W).

Similar to the electrode member 41, the electrode member 43 prevents an increase in the parasitic resistance of the switching element SEL. Generally, a material different from that of the electrode member 41 is adopted for the electrode member 43. For example, the electrode member 43 contains at least one material selected from materials not selected for the electrode member 41 from among the materials of carbon (C), carbon nitride (CN), tungsten nitride (WN), and titanium nitride (TiN).

By adopting different materials for the electrode members 41 and 43, a polarity asymmetry is generated in the switching characteristics of the switching element SEL. That is, the switching characteristics of the switching element SEL are different between the case when a positive voltage is applied from the electrode member 41 to the electrode member 43 (that is, in the direction of the arrow A1) and the case when a positive voltage is applied from the electrode member 43 to the electrode member 41 (that is, in the direction of the arrow A2). Thereby, the characteristics of the memory cell MC including the switching element SEL have a similar asymmetry according to applied voltage polarity. In the following description, for convenience, when a positive voltage is applied from the electrode member 41 to the electrode member 43 this is referred to as a "first polarity", and when a positive voltage is applied from the electrode member 43 to the electrode member 41 this is referred to as a "second polarity".

1.2 Operation

Next, the operation of the magnetic storage device according to the first embodiment will be described.

1.2.1 Selection Operation of Memory Cell

A selection operation of memory cells in the magnetic storage device according to the first embodiment will be described with reference to FIG. 6. In the following description, a memory cell MC to be written or read, that is, a memory cell MC associated with both a selected word line WL and a selected bit line BL is referred to as a selected memory cell MC or a targeted memory cell MC.

Figure 6:
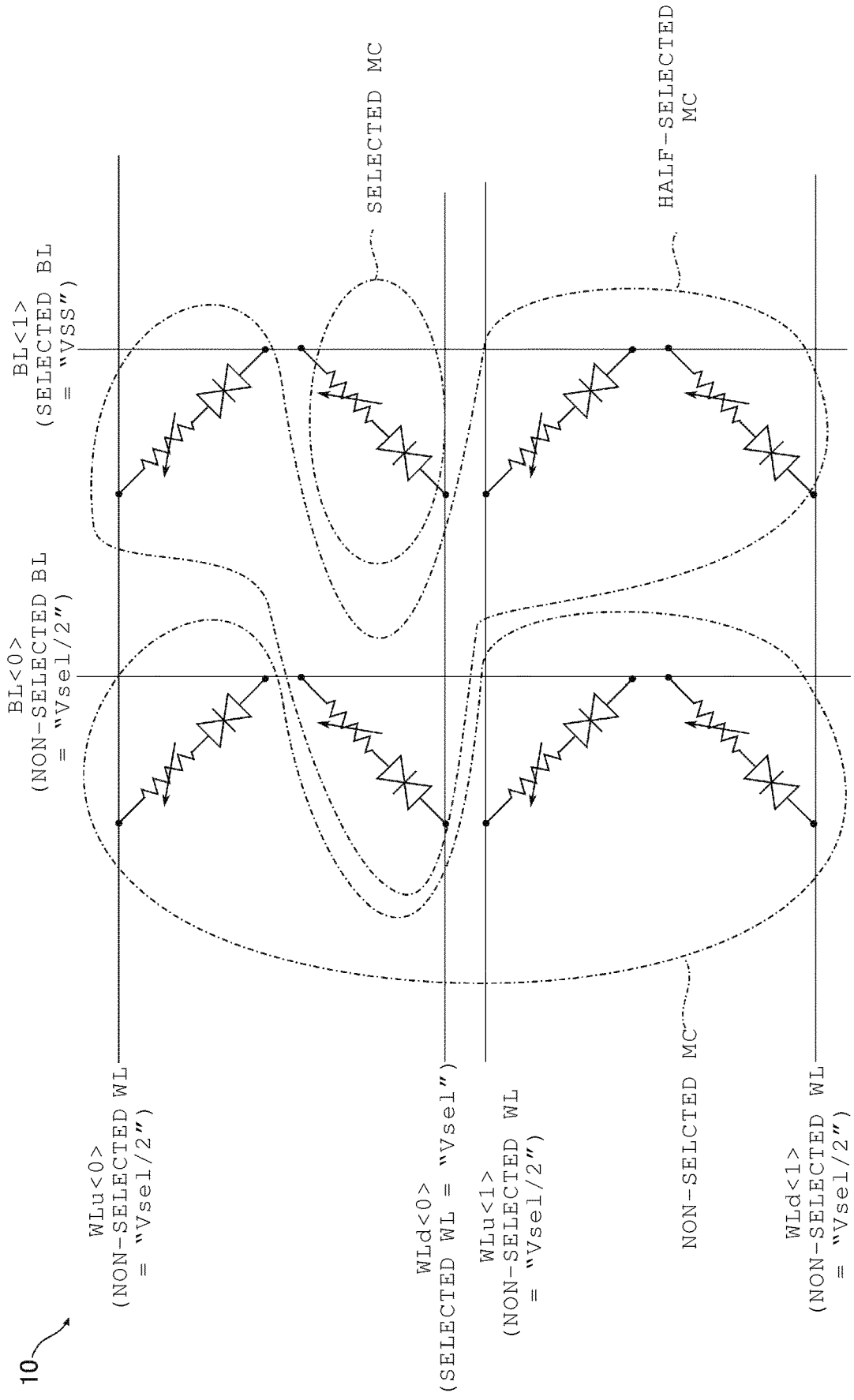
FIG. 6 is a schematic view related to aspects of a memory cell selection operation in a magnetic storage device according to a first embodiment.

FIG. 6 is a schematic view showing an outline of a selection operation of the memory cell in the magnetic storage device according to the first embodiment. In FIG. 6, eight memory cells MC connected between the bit lines BL<0> and BL<1> and word lines WLu<0>, WLd<0>, WLu<1>, and WLd<1> are depicted as an example.

As shown in FIG. 6, the row selection circuit 11 and the column selection circuit 12 are controlled so that a voltage Vsel is applied between the selected word line WL and the selected bit line BL. The voltage Vsel is a voltage larger than the threshold voltage Vt of the switching element SEL. The case where the voltage Vsel is applied to a selected word line WLd<0> and a voltage VSS is applied to a selected bit line BL<1> is shown as an example in FIG. 6. The voltage VSS is a ground voltage (0 V), for example.

The voltage Vsel is applied to a selected memory cell MC. Therefore, a voltage equal to or larger than the threshold voltage Vt is applied to the switching element SEL in the selected memory cell MC. As a result, the switching element SEL in the selected memory cell MC is turned on, and a write current or a read current can flow through the magnetoresistive effect element MTJ in the selected memory cell MC. When the direction of the flowing current is to be reversed, the row selection circuit 11 and the column selection circuit 12 may be controlled to apply the voltage Vsel to the selected bit line BL<1> and apply the voltage VSS to the selected word line WLd<0>.

The row selection circuit 11 and the column selection circuit 12 are controlled so that the voltage Vsel/2 is supplied to the non-selected word lines WL and the non-selected bit lines BL. The voltage Vsel/2 is a voltage smaller than the threshold voltage Vt. In the example of FIG. 6, the case where the voltage Vsel/2 is applied to the word lines WLu<0>, WLd<1>, and WLu<1>, and a bit line BL<0> is shown as an example. The memory cells MC provided between a selected bit line BL and a non-selected word line WL and the memory cells MC provided between a selected word line WL and a non-selected bit line BL are referred to as a half-selected memory cell MC or a memory cell MC in a half-selected state. The voltage Vsel/2 is applied to each half-selected memory cell MC. Therefore, a voltage less than the threshold voltage Vt is applied to the switching element SEL in the half-selected memory cells MC. Thereby, the switching element SEL in the half-selected memory cell MC is turned off, and it is possible to prevent the write current or the read current from following through the magnetoresistive effect element MTJ in the half-selected memory cells MC.

The memory cells MC provided between the non-selected bit line BL and the non-selected word line WL are referred to as non-selected memory cells MC. Since the voltage Vsel/2 is applied to the non-selected bit lines BL and the non-selected word lines WL, no voltage drop occurs across the non-selected memory cells MC. Therefore, the switching element SEL in the non-selected memory cell MC is turned off, and it is possible to prevent the write current or the read current from following through the magnetoresistive effect element MTJ in the non-selected memory cells MC.

1.2.2 IV Characteristics of Memory Cell

Next, the current-voltage characteristics ((IV characteristics) of the memory cells MC according to the polarity across the switching element SEL in the magnetic storage device according to the first embodiment will be described with reference to FIG. 7.

Figure 7:
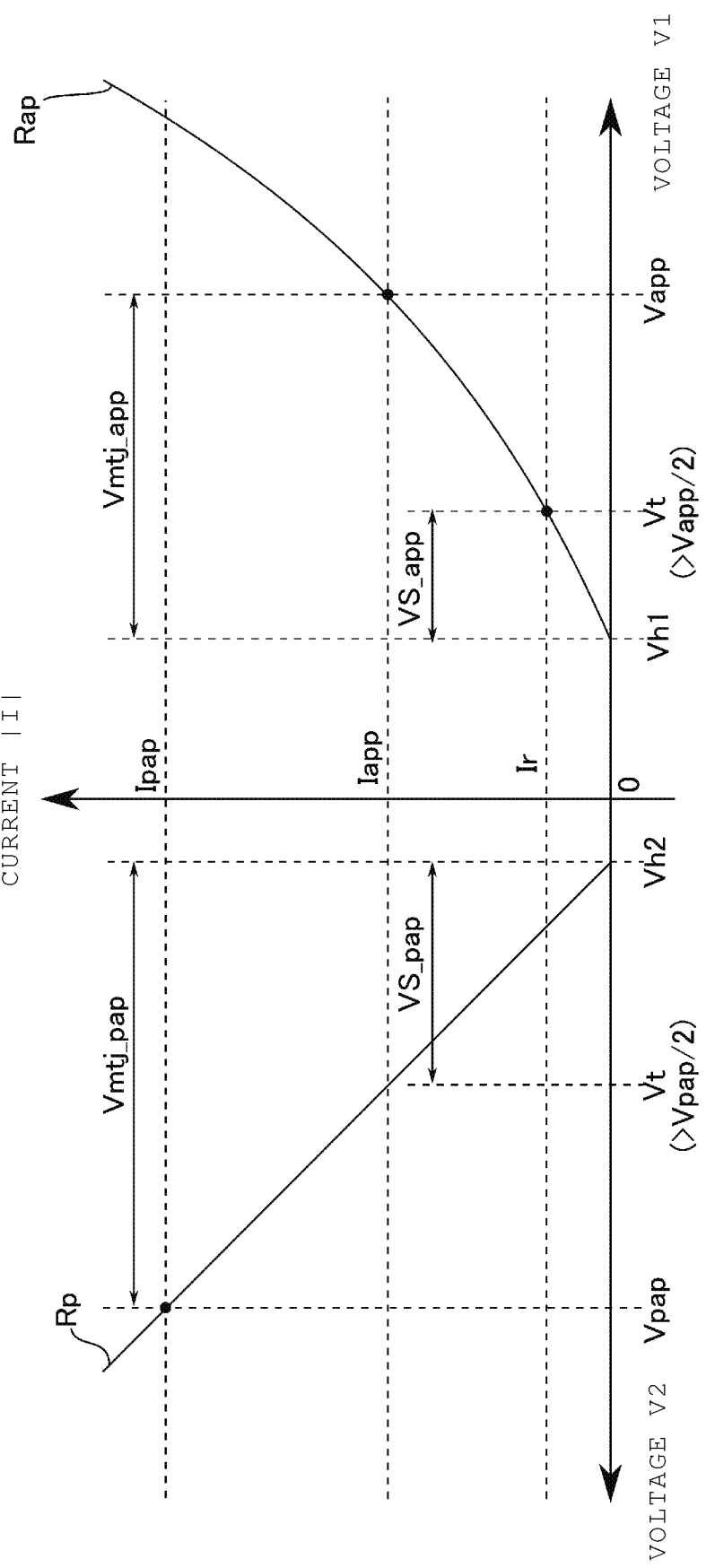
FIG. 7 is a diagram depicting a relationship between a write operation and a read operation and current-voltage characteristics of a memory cell in a magnetic storage device according to the first embodiment.

FIG. 7 is a diagram showing a relationship between a write operation and a read operation and IV characteristics of a memory cell MC in the magnetic storage device according to the first embodiment. In FIG. 7, the horizontal axis represents the voltage applied to the memory cell MC and the vertical axis represents the absolute value of the current flowing through the memory cell MC. The IV characteristics of the memory cell MC when the voltage and the absolute value of the current are linear is shown. In FIG. 7, the portion of the horizontal axis directed to the right from the center (0V) point corresponds to the first polarity (voltage V1), and the portion of the horizontal axis directed to the left from the center (0V) point corresponds to the second polarity (voltage V2).

As shown in FIG. 7, the IV characteristics of the memory cell MC is represented by lines Rap and Rp. When the magnetoresistive effect element MTJ is in the high resistance state, the line Rap represents the relationship between the voltage V1 being applied to the memory cell MC in the direction of the arrow A1 in FIG. 5 and the current |I| flowing through the memory cell MC at that time. When the magnetoresistive effect element MTJ is in the low resistance state, the line Rp represents the relationship between the voltage V2 being applied to the memory cell MC in the direction of the arrow A2 in FIG. 5 and the current |I| flowing through the memory cell MC at that time.

For the first polarity, a write operation of data value "0" (that is, a write operation for changing the magnetoresistive effect element MTJ from the high resistance state to the low resistance state) is executed. In the following, it is assumed that the magnetoresistive effect element MTJ is in the high resistance state.

As described above, since the switching element SEL is in the high resistance state when the voltage V1 is equal to or less than the threshold voltage Vt, no current (|I|=0) flows in the memory cell MC. On the other hand, the switching element SEL is switched to the low resistance state when the voltage V1 increases and exceeds the threshold voltage Vt, and thereafter the state may be regarded as a low resistance with a voltage Vh1 (hold voltage or voltage drop). Therefore, immediately after the switching element SEL is switched to the low resistance state, a voltage VS_app=(Vt−Vh1) is applied to the magnetoresistive effect element MTJ, and a spike current VS_app/Rap flows.

In the case of reading data from memory cell MC, by executing a read operation when the magnetoresistive effect element MTJ is in the high resistance state, data may be read with a smaller read current. For example, the magnitude of a read current Ir may be set to the minimum value of the amount of current flowing through the magnetoresistive effect element MTJ in the high resistance state, that is, the magnitude of about the spike current VS_app/Rap described above.

Thereafter, when the voltage V1 further increases, the current |I| flowing through the memory cell MC increases along the line Rap. Then, when the voltage V1 increases to a voltage Vapp, the amount of voltage drop in the magnetoresistive effect element MTJ becomes Vmtj_app (=Vapp−Vh1), and the current |I| reaches the write current Iapp. The write operation of data value "0" is executed under such conditions.

As described above, in the write operation of data value "0", the voltage V1 corresponding to a voltage Vapp/2 is applied to the half-selected memory cell MC. Therefore, as a condition for not selecting a half-selected memory cell MC erroneously, the threshold voltage Vt of the switching element SEL is set to a value larger than the voltage Vapp/2.

Next, the second polarity will be described. In the second polarity, a write operation of data value "1" (that is, a write operation of changing the magnetoresistive effect element MTJ from the low resistance state to the high resistance state) is executed. In the second polarity, the switching element SEL has a voltage Vh2 lower than the voltage Vh1 for the first polarity. In the following, it is assumed that the magnetoresistive effect element MTJ is in the low resistance state.

As described above, since the switching element SEL is in the high resistance state when the voltage V2 is equal to or less than the threshold voltage Vt, no current (|I|=0) flows in the memory cell MC. On the other hand, the switching element SEL is switched to the low resistance state when the voltage V2 increases and exceeds the threshold voltage Vt, and thereafter the state may be regarded as a low resistance having the voltage Vh2 (hold voltage or voltage drop). Therefore, immediately after the switching element SEL is switched to the low resistance state, the voltage VS_pap=(Vt−Vh2) is applied to the magnetoresistive effect element MTJ, and a spike current VS_pap/Rp flows. If the threshold voltage Vt does not change depending on polarity, the voltage VS_pap is higher than the voltage VS_app because the voltage Vh2 is lesser in magnitude than the voltage Vh1.

Thereafter, when the voltage V2 further increases, the current |I| flowing through the memory cell MC increases along the line Rp. Then, when the voltage V2 increases to the voltage Vpap, the amount of voltage drop in the magnetoresistive effect element MTJ becomes Vmtj_pap (=Vpap−Vh2), and the current |I| reaches the write current Ipap. By setting the voltage Vh2 to be lower than the voltage Vh1, the voltage Vpap can be lowered to about the voltage Vapp. That is, the voltage Vpap may be higher than the voltage Vapp and may be equal to the voltage Vapp. The write operation of data value "1" is executed under such conditions.

As described above, in the write operation of data value "1", the voltage V2 corresponding to the voltage Vpap/2 is applied to the half-selected memory cell MC. Therefore, as a condition for not selecting a half-selected memory cell MC erroneously, the threshold voltage Vt of the switching element SEL is set to a value larger than the voltage Vpap/2.

1.3. Effects According to the Present Embodiment

According to the first embodiment, erroneous writing of data can be prevented. The present effect will be described below with reference to the comparative example in FIG. 8.

Figure 8:
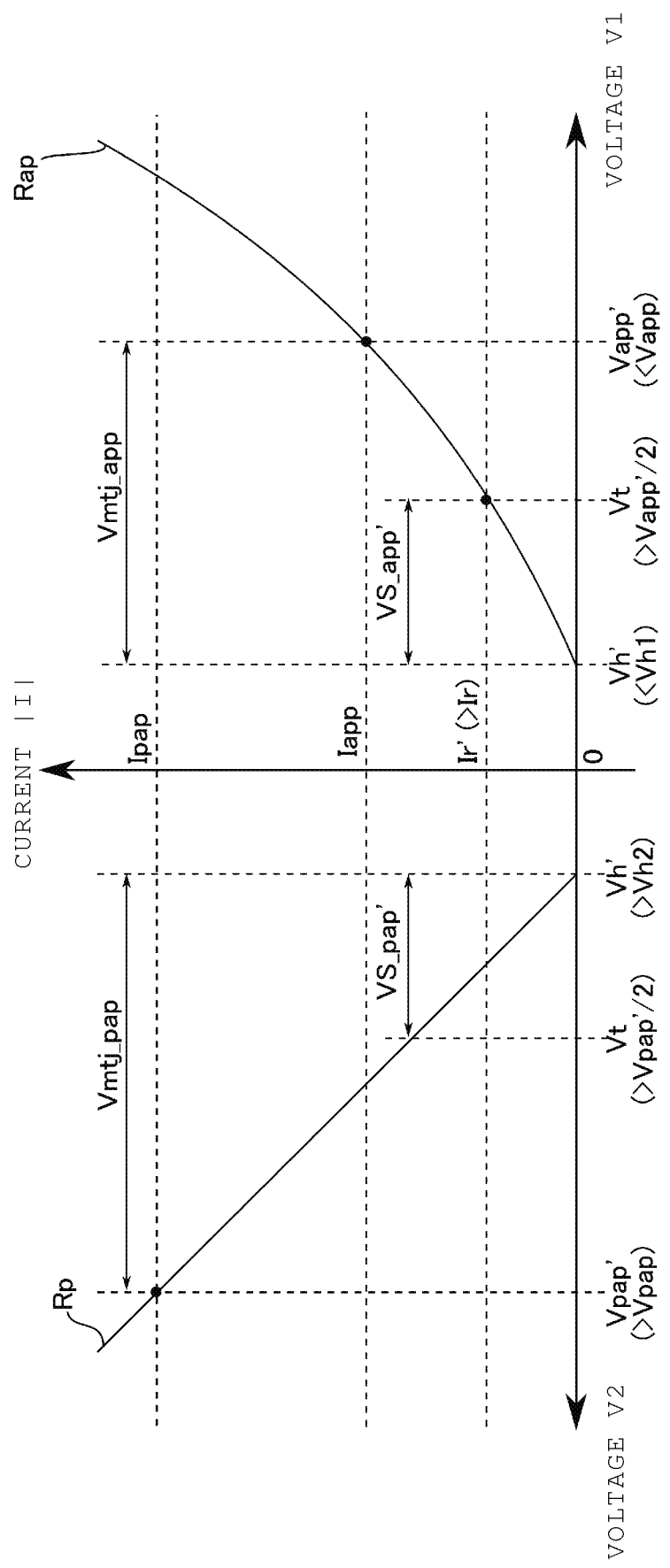
FIG. 8 is a diagram depicting a relationship between a write operation and a read operation and current-voltage characteristics of a memory cell in a magnetic storage device according to a comparative example.

FIG. 8 is a diagram showing a relationship between a write operation and a read operation and IV characteristics of a memory cell in a magnetic storage device according to a comparative example. FIG. 8 corresponds to FIG. 7 and shows the case where hold voltages Vh' have the same magnitude without shifting according to the polarity. That is, the hold voltage Vh' according to the comparative example is lower in magnitude than the voltage Vh1 yet greater in magnitude than the voltage Vh2.

As shown in FIG. 8, in the first polarity, the switching element SEL is switched to the low resistance state when the voltage V1 exceeds the threshold voltage Vt, and thereafter the state is regarded as a constant resistance having the voltage drop amount Vh'. Thereby, immediately after the switching element SEL is switched to the low resistance state, a voltage VS_app'=(Vt−Vh') is applied to the magnetoresistive effect element MTJ, and a spike current VS_app'/Rap flows. Since the hold voltage Vh' is lower than the voltage Vh1, the voltage VS_app' is higher than the voltage VS_app. Therefore, the spike current VS_app'/Rap is larger than the spike current VS_app/Rap. A read current Ir' in the case of reading data from the memory cell MC has a magnitude of about the current VS_app'/Rap larger than the read current Ir shown in FIG. 7.

It is desirable that the spike current and the read current are set to smaller values because there is a possibility that data of the magnetoresistive effect element MTJ is written unintentionally. According to the first embodiment, the switching element SEL is set such that the voltage Vh1 for the first polarity is higher than the hold voltage Vh'. As a result, it is possible to make the spike current VS_app/Rap and the read current Ir smaller than the spike current VS_app'/Rap and the read current Ir', respectively, thereby preventing erroneous writing.

In the second polarity, the switching element SEL of the comparative example is switched to the low resistance state when the voltage V2 increases and exceeds the threshold voltage Vt, and thereafter the state is regarded as a constant resistance having the voltage drop amount Vh'. Thereafter, when the voltage V2 further increases, the current |I| increases along the line Rp in the magnetoresistive effect element MTJ. Then, when the voltage V2 increases to a voltage Vpap, the amount of voltage drop in the magnetoresistive effect element MTJ becomes Vmtj_pap (=Vpap'–Vh'), and the current |I| reaches the write current Ipap. Therefore, a voltage Vpap' to be applied to the memory cell MC when the write current Ipap flows is higher than the voltage Vpap by the difference between the hold voltage Vh' and the voltage Vh2.

It is desirable that the write voltages Vpap and Vapp are set to lower values so that the half values thereof do not exceed the threshold voltage Vt and a half-selected memory cell MC is not selected erroneously. In particular, the voltage Vpap may be higher than the voltage Vpap due to the write current Ipap being larger than the write current Iapp, and the restriction on the threshold voltage Vt may be more severe. According to the first embodiment, the switching element SEL is set such that the voltage Vh2 for the second polarity is lower than the hold voltage Vh'. As a result, it is possible to make the write voltage Vpap lower than the write voltage Vpap', and further, it is possible to prevent erroneous writing due to an erroneous selection of a half-selected memory cell MC.

2. Modification Examples

The present disclosure is not limited to the above-described first embodiment and various modifications may be applied.

In the switching element SEL described for the first embodiment, the case where the threshold voltage Vt has no difference according to polarity has been described, but the present disclosure is not limited thereto. That is, by providing the configuration described in conjunction with FIG. 5, the switching element SEL can also provide polarity asymmetry with respect to the threshold voltage Vt. For example, in the case of shifting the threshold voltage Vt in the same direction as the shift direction of the hold voltage Vh, it is possible to make the threshold voltage Vt in the second polarity lower than in the case shown in FIG. 7. As a result, the voltage VS_pap (=Vt−Vh2) can be further lowered, and the spike current in the second polarity can be lessened. In addition, in the case of shifting the threshold voltage Vt in the direction opposite to the shift direction of the hold voltage Vh, it is possible to make the threshold voltage Vt in the first polarity higher than in the case shown in FIG. 7. Thus, in the write operation of data "0", the restriction (Vapp/2<Vt) for not selecting a half-selected memory cell MC erroneously can be relaxed.

In the memory cells MC described in conjunction with the first embodiment, the case where the magnetoresistive effect element MTJ is provided below the switching element SEL was described, but the magnetoresistive effect element MTJ may instead be provided above the switching element SEL.

In the magnetoresistive effect element MTJ described in conjunction with the first embodiment, the case of a top-free structure in which the storage layer SL is provided above the reference layer RL was described, but the magnetoresistive effect element MTJ may have a bottom-free structure in which the storage layer SL is provided below the reference layer RL. In this case, the direction of the write current would be opposite to that shown in FIG. 5, and accordingly the polarity of the switching element SEL is also reversed. That is, by setting the direction from the electrode member 41 to the electrode member 43 to be the direction of the write current of data value "0", the same effect as that of the first embodiment can otherwise be obtained.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A magnetic storage device, comprising:
a memory cell having a magnetoresistive effect element and a switching element connected in series, wherein the magnetoresistive effect element is configured to:
    change from a first resistance state to a second resistance state that is lower resistance than the first resistance state in response to a first write operation in which a current flows in a first direction through the memory cell; and
    change from the second resistance state to the first resistance state in response to a second write operation in which a current flows in a second direction, opposite to the first direction, in the memory cell, and
the switching element has asymmetric characteristics with respect to polarity across the switching element such that a first voltage drop across the switching element for current flows in the first direction is different from a second voltage drop across the switching element for current flows in the second direction.

2. The magnetic storage device according to claim 1, wherein the switching element includes:
a first electrode layer;
a second electrode layer of a different material than the first electrode layer; and
a switching layer between the first electrode layer and the second electrode layer.

3. The magnetic storage device according to claim 2, wherein the first electrode layer and the second electrode layer each comprise at least one material selected from the group of carbon, carbon nitride, tungsten nitride, and titanium nitride.

4. The magnetic storage device according to claim 1, wherein a magnitude of a first write voltage applied in the first write operation and a magnitude of a second write voltage applied in the second write operation are equal.

5. The magnetic storage device according to claim 1, wherein the switching member comprises at least one chalcogen element selected from tellurium, selenium, and sulfur.

6. The magnetic storage device according to claim 5, wherein the switching member further comprises at least one element selected from boron, aluminum, gallium, indium, carbon, silicon, germanium, tin, arsenic, phosphorus, antimony, titanium, and bismuth.

7. The magnetic storage device according to claim 1, wherein the switching element has:
   a first threshold voltage for a first voltage polarity corresponding to the first direction; and
   a second threshold voltage for a second voltage polarity corresponding to the second direction.

8. The magnetic storage device according to claim 7, wherein the first threshold voltage and the second threshold voltage are equal.

9. The magnetic storage device according to claim 7, wherein the first threshold voltage and the second threshold voltage are different from each other.

10. The magnetic storage device according to claim 7, wherein
   the first threshold voltage has a magnitude greater than one-half a magnitude of a first write voltage in the first write operation, and
   the second threshold voltage has a magnitude greater than one-half a magnitude of a second write voltage in the second write operation.

11. The magnetic storage device according to claim 1, wherein the magnetoresistive effect element includes:
   a first ferromagnetic layer;
   a second ferromagnetic layer; and
   a nonmagnetic layer between the first ferromagnetic body and the second ferromagnetic body.

12. A magnetic storage device, comprising:
   a plurality of memory cells, each memory cell including a magnetoresistive effect element and a switching element connected in series between a word line and a bit line, wherein
   the magnetoresistive effect elements are configured to:
      change from a first resistance state to a second resistance state that is lower resistance than the first resistance state in a first write operation in which a current flows through the memory cell in a first direction from the word line to the bit line; and
      change from the second resistance state to the first resistance state in a second write operation in which a current flows through the memory cell in a second direction opposite to the first direction, and
   the switching element has asymmetric characteristics with respect to polarity across the switching element such that a first voltage drop across the switching element for current flows in the first direction is different from a second voltage drop across the switching element for current flows in the second direction.

13. The magnetic storage device according to claim 12, wherein the switching element has:
   a first threshold voltage for a first voltage polarity corresponding to the first direction; and
   a second threshold voltage for a second voltage polarity corresponding to the second direction.

14. The magnetic storage device according to claim 13, wherein the first threshold voltage and the second threshold voltage are equal.

15. The magnetic storage device according to claim 13, wherein the first threshold voltage and the second threshold voltage are different from each other.

16. The magnetic storage device according to claim 13, wherein
   the first threshold voltage has a magnitude greater than one-half a magnitude of a first write voltage in the first write operation, and
   the second threshold voltage has a magnitude greater than one-half a magnitude of a second write voltage in the second write operation.

17. The magnetic storage device according to claim 12, wherein the magnetoresistive effect element includes:
   a first ferromagnetic layer;
   a second ferromagnetic layer; and
   a nonmagnetic layer between the first ferromagnetic body and the second ferromagnetic body.

18. A magnetic storage device, comprising:
   a plurality of bit lines and a plurality of word lines;
   a plurality of memory cells, each memory cell having a magnetoresistive effect element and a switching element connected in series between a bit line and a word line, wherein
   each magnetoresistive effect element is configured to:
      change from a first resistance state to a second resistance state that is lower resistance than the first resistance state in response to a first current flow in a first direction through the memory cell; and
      change from the second resistance state to the first resistance state in response to a second current flow in a second direction through the memory cell, the second direction being opposite of the first direction, and
   the switching element has asymmetric characteristics with respect to polarity across the switching element such that a first voltage drop across the switching element for current flows in the first direction is different from a second voltage drop across the switching element for current flows in the second direction.

19. The magnetic storage device according to claim 18, wherein the switching element has:
   a first threshold voltage for a first voltage polarity corresponding to the first direction; and
   a second threshold voltage for a second voltage polarity corresponding to the second direction, wherein
   the first and second threshold voltages are different from each other.

* * * * *